US00RE37882E

(19) United States
(12) Reissued Patent
Ezawa et al.

(10) Patent Number: US RE37,882 E
(45) Date of Reissued Patent: Oct. 15, 2002

(54) SEMICONDUCTOR DEVICE MANUFACTURING METHOD

(75) Inventors: Hirokazu Ezawa, Tokyo (JP); Masahiro Miyata, Urayasu (JP)

(73) Assignee: Kabushiki Kaisha Toshiba, Kawasaki (JP)

(21) Appl. No.: 09/000,865

(22) Filed: Dec. 30, 1997

Related U.S. Patent Documents

Reissue of:
(64) Patent No.: 5,480,839
Issued: Jan. 2, 1996
Appl. No.: 08/179,714
Filed: Jan. 11, 1994

(30) Foreign Application Priority Data

Jan. 15, 1993 (JP) ..... 5-021738

(51) Int. Cl.[7] ..... H01L 21/44
(52) U.S. Cl. ..... 438/107; 438/622; 438/627; 438/641; 257/737; 216/13; 427/46
(58) Field of Search ..... 438/612, 613, 438/618, 650, 622, 627, 641; 257/737, 758, 750, 773; 216/13; 427/96

(56) References Cited

U.S. PATENT DOCUMENTS

| | | | | |
|---|---|---|---|---|
| 4,712,161 A | * | 12/1987 | Pryor et al. | 361/779 |
| 4,914,056 A | * | 4/1990 | Okumura | 257/773 |
| 4,917,759 A | * | 4/1990 | Fisher et al. | 257/763 |
| 4,991,285 A | | 2/1991 | Shaheen et al. | |
| 5,056,215 A | * | 10/1991 | Blanton | 361/783 |
| 5,128,746 A | * | 7/1992 | Pennisi et al. | 257/780 |
| 5,136,363 A | * | 8/1992 | Endo et al. | 257/781 |
| 5,139,969 A | * | 8/1992 | Mori | 438/613 |
| 5,277,786 A | * | 1/1994 | Kawakami | 438/88 |
| 5,282,565 A | * | 2/1994 | Melton | 229/180.22 |
| 5,290,732 A | * | 3/1994 | Kumar et al. | 438/614 |
| 5,296,736 A | * | 3/1994 | Frei et al. | 257/703 |
| 5,318,651 A | * | 6/1994 | Matsui et al. | 156/273.5 |
| 5,457,881 A | | 10/1995 | Schmitdt | |
| 5,529,634 A | | 6/1996 | Miyata et al. | |

FOREIGN PATENT DOCUMENTS

| | | |
|---|---|---|
| EP | 0002185 | * 10/1978 |
| JP | 50-064767 | 6/1975 |
| JP | 2-113553 | 4/1990 |
| JP | 2-290095 | * 11/1990 |
| JP | 3-227242 | 10/1991 |
| JP | 4-17939 | 2/1992 |
| JP | 4-352387 | 12/1992 |

OTHER PUBLICATIONS

U.S. patent application Ser. No. 08/075,373, filed Jun. 14, 1993.*

Official Action from Japanese Patent Office in application No. 21738/93, mailing date Jan. 30, 2001, and English language translation.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

With a semiconductor device manufacturing method, a lower-layer interconnection is formed on a circuit board on which a plurality of semiconductor chips are mounted. Using a screen plate with openings corresponding to desired positions on the lower-layer interconnection, screen printing of a metal paste is effected, and the printed metal paste is dried and calcined by heat treatment to form a metal pillar on the lower-layer interconnection. An insulating film covering the lower-layer interconnection and the metal pillar is formed so that the tip of the metal pillar may be exposed. An upper-layer interconnection is formed on the insulating film so that this layer may contact with the exposed tip of the metal pillar.

33 Claims, 4 Drawing Sheets

SEMICONDUCTOR DEVICE MANUFACTURING METHOD

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a semiconductor device manufacturing method for connecting interconnects to each other in multilayer interconnection substrates, and more particularly to a semiconductor device manufacturing method effective for multichip modules (MCMs).

2. Description of the Related Art

To make semiconductor devices denser and smaller, multichip packages, where more than one semiconductor chip on which integrated circuit elements and discrete semiconductor elements are formed is squeezed in a single package, have recently been in use. With conventional packaging forms, where many DIPs (dual-in-line packages) or plug-in packages are mounted in a printed circuit board, the faster LSIs cannot achieve their best performance. That is, the delay time cannot be shortened because the interconnection runners between chips are too long in terms of signal propagation delay time. To overcome this drawback, high-performance, high-packing-density multichip modules (MCMs) have been developed in which many semiconductor chips are mounted on a single semiconductor substrate such as a ceramic substrate or a silicon substrate, and the interconnection length between semiconductor chips is made very short. Connecting interconnects to each other on a circuit board or a semiconductor substrate is one of the important manufacturing processes for forming semiconductor devices such as ICs or LSIs. In particular, as semiconductor devices are more highly integrated and made smaller, forming multilayer interconnects on a circuit board and efficiently connecting them are indispensable for the formation of high-performance semiconductor devices.

Referring to FIG. 1, a method of connecting multilayer interconnects on conventional MCM multilayer interconnection substrates will be explained. For example, on a silicon substrate 1 on whose surface a thermal oxide film of 1000 Å thick is formed, a first layer interconnection 2 with a desired pattern is formed. This interconnection 2 has a multilevel structure of Ti/Cu/Ti comprising of two Ti layers of approximately 600 Å thick and a Cu layer of approximately 3 $\mu$m thick sandwiched between these two Ti layers. The structure is formed by vapor deposition or sputtering techniques.

Then, for example, a polyimide solution is applied to the entire surface of the semiconductor substrate and dried to form a film. Next, by lithography, a contact hole 31 is made in the film. After this, a non-imido film is calcined to form a polyimide film 3 serving as an interlayer insulating film. Then, on the polyimide film 3, a second layer interconnection 4 of Ti/Cu/Ti, Al, or the like, is formed in a similar manner to the formation of the first layer interconnection 2. At this time, because the second layer interconnection 4 is also formed in the contact hole 31, the first layer interconnection 2 and the second layer interconnection 4 are electrically connected to each other in the contact hole 31. This process is repeated and the interconnects of multilevel layers are connected to one another.

Making the contact hole 31 requires photolithography techniques, etching techniques such as RIE, and such processes as peeling photoresist. Although in the case of polyimide, wet etching can be effected using a choline solution, other organic insulating films must be formed by dry etching. Because the use of wet etching solutions is limited severely, the properties of the films are incompatible with production cost. In addition, as the density of interconnects of the upper layer increases, the upper layer interconnects must be formed on the flat lower-layer surface in a manner that avoids the contact hole in the polyimide film 3 of the lower layer previously formed. This makes it necessary to fill up the contact hole. With this backdrop, the simplification of manufacturing processes is desired.

SUMMARY OF THE INVENTION

Accordingly, the object of the present invention is to provide a method of manufacturing semiconductor devices which facilitate the connection of interconnects and the flattening of interlayer insulating films and are suitable for MCMs.

The foregoing object is accomplished by providing a semiconductor device manufacturing method comprising: the step of forming a lower-layer interconnection on a circuit board on which a plurality of semiconductor chips are mounted; the step of forming a metal pillar on the circuit board so that the pillar may contact with at least the lower-layer interconnection, the metal pillar forming step including the step of effecting screen printing of a metal paste using a screen plate with openings corresponding to desired positions on the lower-layer interconnection and the step of drying and calcining the printed metal paste by heat treatment to form the metal pillar; the step of forming an insulating film covering the lower-layer interconnection and the metal pillar so that the tip of the metal pillar may be exposed; and the step of forming an upper-layer interconnection on the insulating film so that this layer may contact with the exposed tip of the metal pillar.

With this semiconductor device manufacturing method, because a metal pillar to connect interconnects to each other is formed by screen printing in forming multilayer interconnection on a substrate, it is not necessary to make a hole in the interlayer insulating films. Thus, a lithography process and an etching process needed to make a hole can be eliminated. Further, when the tip of the metal pillar is exposed by etching back the interlayer insulating film, the surface of the interlayer insulating film can be flattened. This makes it possible to immediately form the upper-layer interconnects on the flattened surface. In this way, the manufacturing processes can be simplified.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Hereinafter, an embodiment of the present invention will be described, referring to the accompanying drawings.

Figure 1:
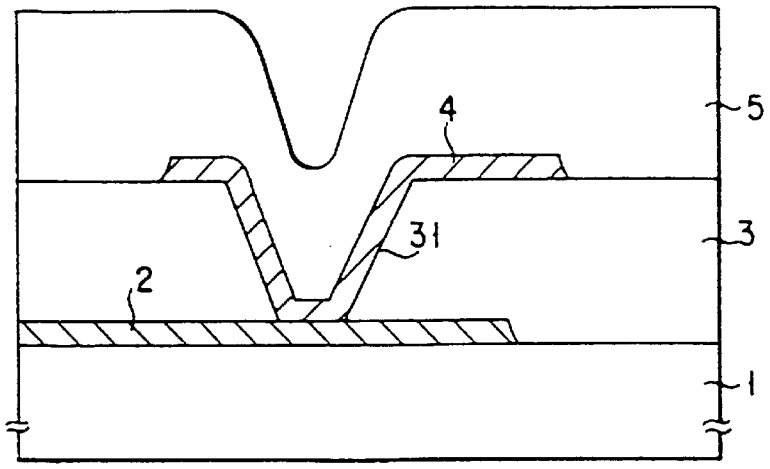
FIG. 1 (PRIOR ART)
FIG. 1 is a sectional view of a portion of a multilayer interconnection substrate for explaining the manufacturing processes of conventional multilayer interconnection.
Figure 2:
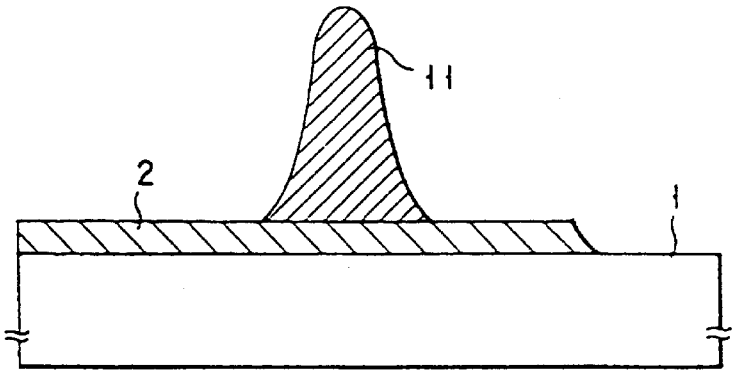
FIG. 2 is a sectional view of a portion of a semiconductor device for explaining one step in a semiconductor device manufacturing method of the present invention.

A first embodiment of the present invention will be described with reference to FIGS. 2 to 5. In FIG. 2, a semiconductor substrate 1 to be formed into a circuit board is a silicon semiconductor substrate. On the main surface of the semiconductor substrate 1 is formed a silicon thermal oxide film (not shown) of approximately 1000 Å thick, on which multilayer interconnects are formed. While in this embodiment, a silicon semiconductor substrate is used, the substrate may be a circuit board made of, for example, AlN on which semiconductor chips are mounted. When a silicon semiconductor substrate is used, it is possible to form an interlayer insulating film of polyimide on the substrate and then form the multilayer interconnects on this film. On the semiconductor substrate 1 on whose surface a silicon oxide film is formed, a first interconnection 2 of a lower layer with a specified pattern is formed. The first interconnection 2 may be the very first interconnection layer or have more than one layer under it on the semiconductor substrate 1.

Ti or a barrier metal containing Ti is deposited to a thickness of approximately 1000 Å, Cu to a thickness of approximately 3 $\mu$m, and Pd to a thickness of approximately 1000 Å, consecutively in that order by vacuum deposition or sputtering techniques. Then, these deposits undergo patterning in a lithography process, in which, for example, Pd is etched by using a mixed solution of HCl, $HNO_3$, and $CH_3COOH$, and Cu and Ti are etched by using a mixed solution of $H_2O_2$ and $C_6H_8O_7$ to form a Pd/Cu/Ti metal interconnection pattern with a width of 20 to 30 $\mu$m, serving as the first interconnection. The interconnection pattern may be formed in another way: a photoresist is formed on the substrate and etched to form an interconnection pattern, through which interconnection metal is deposited on the substrate by, for example, vapor deposition, and finally the photoresist is removed to form an interconnection pattern on the substrate. After the formation of the interconnection pattern, a metal pillar 11 acting as a connection electpillare to connect interconnects to each other is formed by screen printing in a semi-square around portion of approximately 30×30 to 50×50 $\mu m^2$ on the metal interconnection pattern 2. For the printing metal paste, a material containing Au particles approximately 2000 Å in diameter and less than 15 wt. % of glass frit (PbO), was used.

Figure 3:
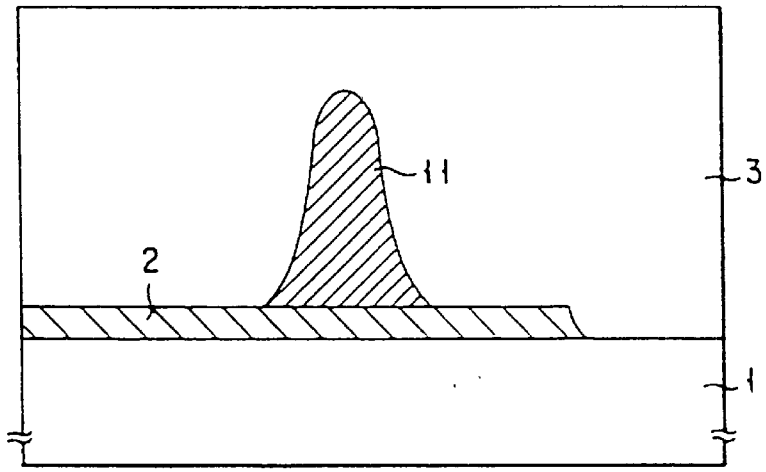
FIG. 3 is a sectional view of a portion of a semiconductor device for explaining one step in a semiconductor device manufacturing method of the present invention.
Figure 4:
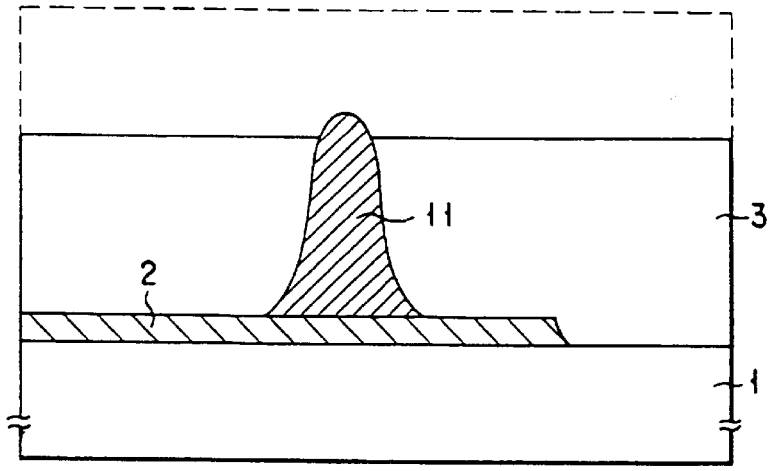
FIG. 4 is a sectional view of a portion of a semiconductor device for explaining one step in a semiconductor device manufacturing method of the present invention.
Figure 5:
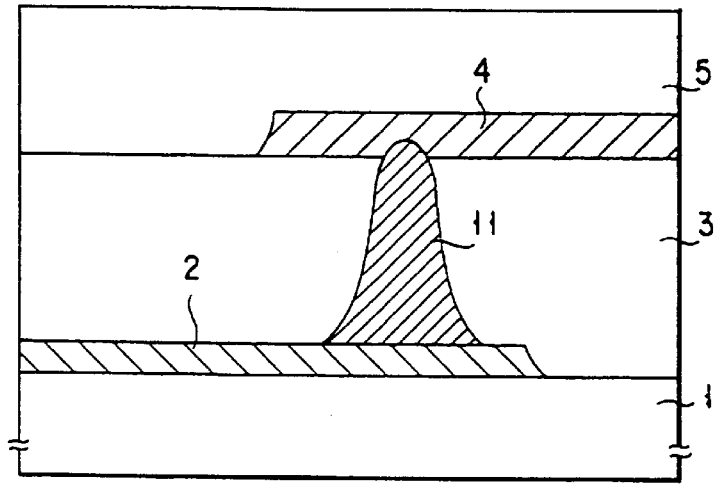
FIG. 5 is a sectional view of a portion of a multilayer interconnection substrate formed by the semiconductor device manufacturing method of the present invention.

After the screen printing of an Au paste on the first interconnection 2, the paste is heated at a rising temperature speed of 200° C./hr and maintained at 450° C. for 30 minutes, thereby calcining the paste to form the Au metal pillar 11. The Au adheres well to the Pd layer at the surface of the first interconnection 2 and has small contact resistance. Then, as shown in FIG. 3, a polyimide solution with a viscosity of approximately 20000 cp is dropped onto the semiconductor substrate 1, which is then spun at a speed of 500 rpm 10 sec. and 1500 rpm 15 sec. in that order. The substrate is then dried and preliminary cured at 150° C./60 min. in a nitrogen atmosphere to form an interlayer insulating film 3, for example pre-polyimide film, comprising of a polyimide film of approximately 30 $\mu$m thick. The material for the interlayer insulating film is not limited to polyimide. For instance, PSG and silicon oxide film may be used. As shown in FIG. 4, the entire surface of the interlayer insulating film 3 is etched back by using a choline solution to expose the tip of the Au metal pillar 11. Then, the final cure is effected at 320° C./30 min. to form a complete interlayer insulating film 3. Next, as shown in FIG. 5, a second interconnection 4 made up of Pd/Cu/Ti serving as an upper layer is formed in the same manner as described above. Although not shown, a third, a fourth, or a further interconnection may be formed through another interlayer insulating film on the interconnection 4 or a protective insulating film 5 made up of, for example, BPSG, may be formed directly on the interconnection 4.

As shown in the figure, to connect the first interconnection to the second one, the Au metal pillar 11 serving as a connection electpillare is used. The Au metal pillar 11 is embedded in the interlayer insulating film 3 to electrically connect the two interconnections 2 and 4 to each other. The calcined Au paste contains PbO, is made of small crystal particles, and has a resistivity of approximately 5 $\mu\Omega$cm higher than that of the bulk. However, even if the recrystallization to form larger crystals cannot be effected by a high-temperature annealing after the formation of the multilayer interconnection because of the heat resistance limit of the interlayer insulating film 3, the Au metal pillar 11 whose height and diameter approximate 20 $\mu$m and 30 $\mu$m, respectively, has a resistance of 1.4 m$\Omega$, which thus has no adverse effect on the characteristics of the semiconductor device. Since no surface oxidation occurs, the contact resistance between the Au metal pillar 11 and the second interconnection 4 is small. With this embodiment, by etching back the polyimide, the tip of the metal pillar is exposed and flattened. This makes it possible to use screen printing techniques to form a metal interconnection on the flattened surface. However, because the upper limit of the calcination temperature for the metal paste is restricted to temperatures below the heat-proof temperature of the interlayer insulating film 3, usable paste materials are limited.

Figure 6:
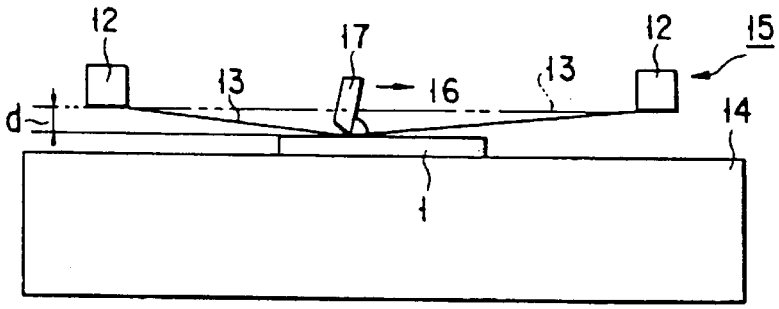
FIG. 6 schematically shows screen printing by a screen printing press used in the semiconductor device manufacturing method of the present invention.
Figure 7A:
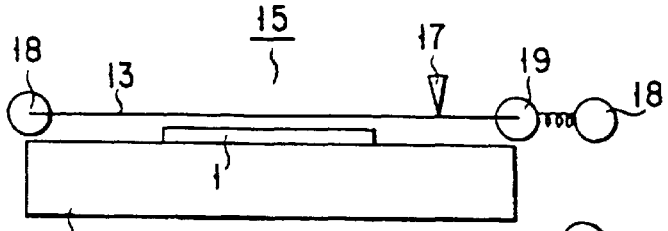
FIGS. 7A to 7D illustrate screen printing by a screen printing press used in the semiconductor device manufacturing method of the present invention.
Figure 7B:
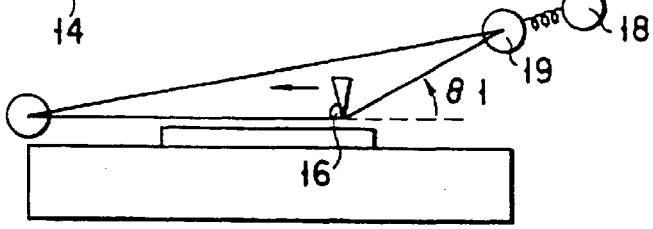
Figure 7C:
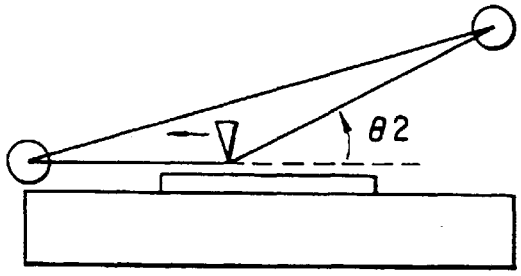
Figure 7D:
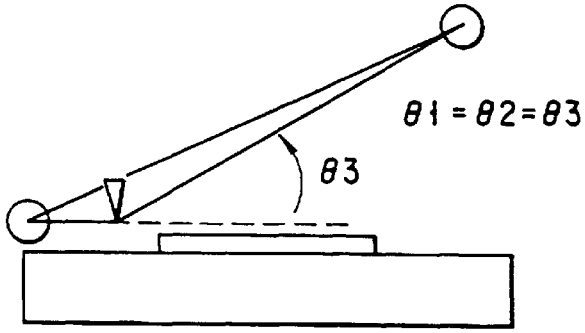

The present invention is characterized by using screen printing techniques. Screen printing is such a method that a pattern consisting of openings and non-openings is formed primarily by photoengraving techniques on a screen spread on a plate to form a screen printing plate, and the pattern is transferred to the printing surface under the screen by applying printing ink to the screen printing plate and sliding a squeegee over the screen surface to press the ink out of the openings to the underlying printing surface. The printing techniques include a conventional method shown in FIG. 6 and a method with highly accuracy shown in FIGS. 7A to 7D. FIG. 6 schematically shows a state where screen printing is being effected by a screen printing press. A plate 15 is made up of a wooden or metal square frame 12 on which a screen 13 is spread and bonded with an adhesive with all sides pulled to give a specified tension. To effect printing, a gap (d) is provided between the semiconductor substrate 1 fixed by vacuum adhesion to a printing table 14 and the screen 13, the frame 12 is secured, and the plate 15 is set to the printing press body.

Figure 8:
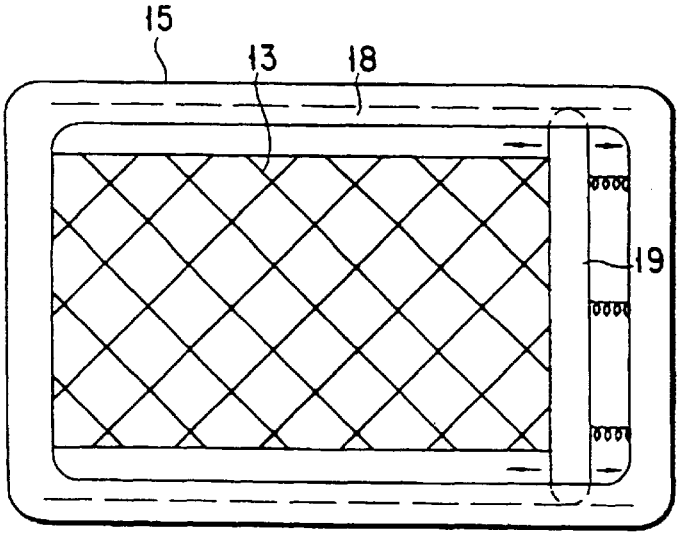
FIG. 8 is a plan view of the screen printing press in FIGS. 7A to 7D.

At this time, the screen 13 is spread horizontally as shown by a two-dot-dash line. In this state, ink 16 is applied onto the screen. Then, the squeegee 17 is pressed against the screen 13 to cause the screen 13 to come into contact with the surface of the semiconductor substrate 1. At this time, the screen 13 is spread out as shown by a solid line. In this state, the squeegee 17 is moved in the direction of arrow to transfer the ink 16 to the semiconductor substrate 1 through the openings in the screen 13. As the squeegee 17 moves, the screen 13 separates from the semiconductor substrate 1 by the action of tension in a manner that consecutively changes the contact position with the substrate 1, thereby effecting printing. In the embodiment, the printing method shown in FIGS. 7A to 7D is used. FIGS. 7A to 7D show a state where screen printing is being effected by a screen printing press. FIG. 8 is its plan view. The printing press is provided with a fixed frame member 18 and a movable frame member 19. The movable frame member 19 moves in an inner groove formed in the fixed frame member 18. It is assumed that the angle formed by the screen 13 with respect to the screen printing surface of the semiconductor substrate 1 is θ. When the constant angle θ (θ1=θ2=θ3) is maintained by raising the movable frame member 19 (i.e., the free end of the plate 15) in synchronization with the movement of the squeegee 17, the gap between the screen printing surface of the semiconductor substrate 1 and the plate 15 is reduced to zero. Because the plate 15 is not deformed due to squeegee pressure, the printing accuracy is improved.

In the embodiment, a semiconductor substrate is used as a circuit board on which semiconductor chips composed of integrated circuits and discrete semiconductor elements. Because the semiconductor substrate is conductive, an oxide film of, for example, silicon or an insulating film of, for example, polyimide, is formed on its surface. On the insulating film-covered surface, semiconductor chips are mounted. A portion of the insulating film may be used as a dielectric for capacitors included in the components of the semiconductor device. To form resistances, conductive films are formed by screen printing techniques in desired places on the insulating film.

Figure 9:
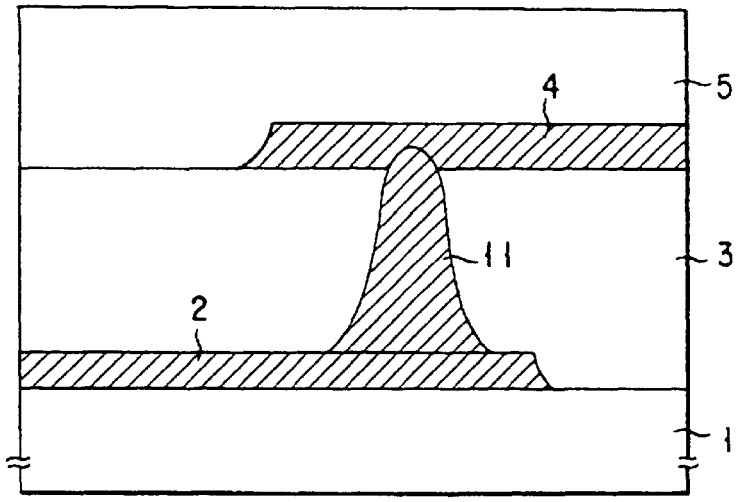
FIG. 9 is a sectional view of a portion of a semiconductor device for explaining an embodiment of the semiconductor device manufacturing method of the present invention.

A second embodiment of the present invention will be described, referring to FIG. 9. FIG. 9 is a sectional view of a circuit board of a semiconductor device formed by this embodiment. For a circuit board 1, an AlN substrate is used. On the substrate, multilayer interconnection is formed. On the AlN substrate, a first interconnection 2 with a specified pattern is formed. To form the interconnection, a metal paste, such as an Ag or Cu paste, containing less than 15 wt. % of glass frit (PbO) is applied onto the AlN substrate 1 via the screen with a specified interconnection pattern shown in FIGS. 7A to 7D, and is calcined to form the first interconnection 2 of, for example, Ag with a width of 20 to 30 μm. Then, a Au metal pillar 11 acting as a connection electpillare to connect interconnects to each other is formed by screen printing in a semi-square around portion of approximately 30×30 to 50×50 $\mu m^2$ on the metal interconnection 2. For the printing metal paste, a material containing Au particles approximately 2000 Å in diameter and less than 15 wt. % of glass frit (PbO) was used.

After the screen printing of an Au paste on the first interconnection 2, the paste is heated at a rising temperature speed of 200° C./hr and maintained at 450° C. for 30 minutes, thereby calcining the paste to form the Au metal pillar 11. Then, a polyimide solution with a viscosity of approximately 20000 cp is dropped onto the semiconductor substrate 1, which is then spun at a speed of 500 rpm/10 sec. and 1500 rpm/15 sec. in that order. The substrate is then dried and set hard at 150° C./60 min. in a nitrogen atmosphere to form an interlayer insulating film 3 consisting of a polyimide film of approximately 30 μm thick. Next, the entire surface of the interlayer insulating film 3 is etched back by using a choline solution to expose the tip of the Au metal pillar 11. Then, the final hardening is effected at 320° C./30 min. to form a complete interlayer insulating film 3. Next, a second interconnection 4 is formed with the screen shown in FIGS. 7A to 7B, as described above. On the interconnection 4, a protective insulating film 5 of, for example, PSG, is formed. Because the upper limit of the calcination temperature for the metal paste is restricted to temperatures below the heat-proof temperature of the interlayer insulating film, usable paste materials are limited. Because in this embodiment, the first and second interconnections and Au metal pillar 11 are all formed by screen printing, the processes are more simplified than the first embodiment.

Figure 10:
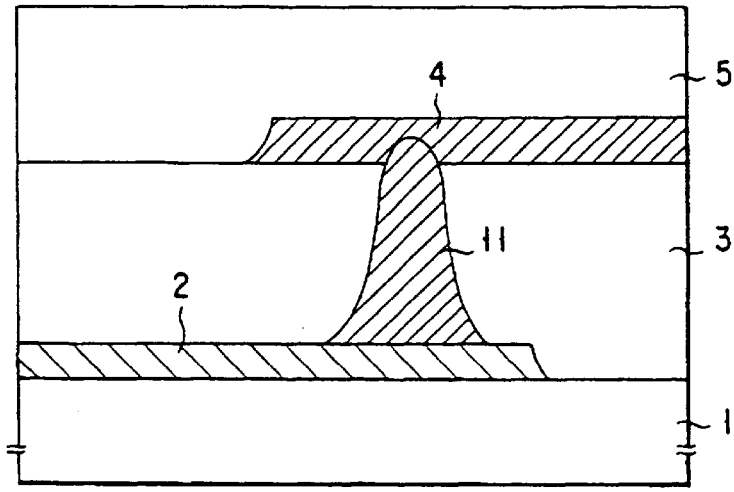
FIG. 10 is a sectional view of a portion of a semiconductor device for explaining another embodiment of the semiconductor device manufacturing method of the present invention.

A third embodiment of the present will be described, referring to FIG. 10. FIG. 10 is a sectional view of a circuit board of a semiconductor device formed by this embodiment. For a circuit board 1, an AlN substrate is used. On the its surface, a first interconnection 2 with a specified pattern is formed. Ti or a barrier metal containing Ti is deposited to a thickness of approximately 1000 Å, Cu to a thickness of approximately 3 μm, and Pd to a thickness of approximately 1000 Å, consecutively in that order by vacuum deposition or sputtering techniques. Then, these deposits undergo patterning in a lithography process, in which, for example, Pd is etched by using a mixed solution of HCl, $HNO_3$, and $CH_3COOH$, and Cu and Ti are etched by using a mixed solution of $H_2O_2$ and $C_6H_8O_7$ to form a Pd/Cu/Ti metal interconnection pattern with a width of 20 to 30 μm, serving as the first interconnection. After this, a metal pillar 11 acting as a connection electrode to connect interconnects to each other is formed by screen printing in a semi-square around portion of approximately 30×30 to 50×50 $\mu m^2$ on the metal interconnection pattern 2. For the printing metal paste, for example, a material containing Au particles approximately 2000 Å in diameter and less than 15 wt. % of glass frit (PbO) was used. After the screen printing of Au paste on the first interconnection 2, the paste is heated at a rising temperature speed of 200° C./hr and maintained at 450° C. for 30 minutes, thereby calcining the paste to form the Au metal pillar 11. Next, a polyimide solution with a viscosity of approximately 20000 cp is dropped onto the semiconductor substrate 1, which is then spun at a speed of 500 rpm/10 sec. and 1500 rpm/15 sec. in that order. The substrate is then dried and set hard at 150° C./60 min. in a nitrogen atmosphere to form an interlayer insulating film 3 consisting of a polyimide film of approximately 30 μm thick. Next, the entire surface of the interlayer insulating film 3 is etched back by using a choline solution to expose the tip of the Au metal pillar 11. Then, the final hardening is effected at 320°

C./30 min. to form a complete interlayer insulating film 3. A second interconnection is then formed by screen printing techniques. To form the interconnection, a metal paste, such as an Ag, Cu, or Al paste, containing less than 15 wt. % of glass frit (PbO) is applied onto the AlN substrate 1 via the screen with a specified interconnection pattern shown in FIG. 6, and is calcined to form the second interconnection 4 of, for example, Ag with a width of 20 to 30 $\mu$m. On this interconnection, a protective insulating film 5 of, for example, PSG, is formed.

Figure 11:
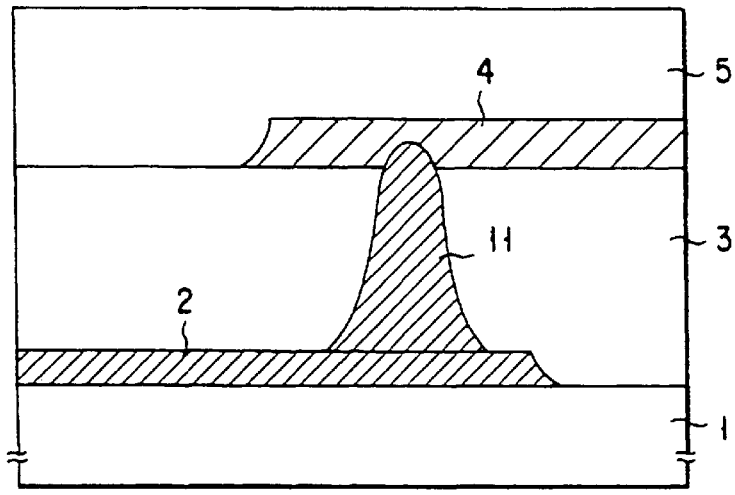
FIG. 11 is a sectional view of a portion of a semiconductor device for explaining still another embodiment of the semiconductor device manufacturing method of the present invention.

While in this embodiment, sputtering techniques are used for the formation of the first interconnection and screen printing techniques are used for the formation of the second interconnection, the first interconnection 2 may be formed by screen printing and the second interconnection 4 be formed by sputtering as shown in FIG. 11.

Although in the above embodiments, the metal pillar 11 formed by the screen printing is made of Au, other materials such as Pd, Pt, or Ag may be used instead.

Furthermore, insulating elements made of, for example, silicone elements can be formed, without performing backing or without using solvents. Hence, the method of manufacturing the semiconductor device includes no step of baking.

In the above embodiments, interconnects are formed by such techniques as sputtering, vacuum deposition, and screen printing. The present invention is not restricted to these techniques. For instance, so-called gas deposition techniques may be used in which vaporized metal is turned by an inert gas into small particles, which are then sprayed on the circuit board to form interconnects by making use of the pressure difference between the place where particles are produced and the place where the circuit board is placed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor device manufacturing method comprising the steps of:

forming a lower-layer interconnection on a circuit board on which a plurality of semiconductor chips are mounted;

forming a metal pillar *having a rounded apex* on said circuit board so that the pillar may contact with at least said lower-layer interconnection, the metal pillar forming step including the step of effecting screen printing of a metal paste using a screen plate with openings corresponding to desired positions on the lower-layer interconnection and the step of drying and calcining said printed metal paste by heat treatment to form the metal pillar;

forming an insulating film covering said lower-layer interconnection and said metal pillar so that the [tip] *rounded apex* of said metal pillar may be exposed; and forming an upper-layer interconnection on said insulating film so that this layer may contact with the exposed [tip] *rounded apex* of said metal pillar.

2. A semiconductor device manufacturing method according to claim 1, wherein said insulating film forming step includes the step of covering the lower-layer interconnection and said metal pillar with an interlayer insulating film, and the step of etching back the surface of said interlayer insulating film until the [tip] *rounded apex* of said metal pillar is exposed.

3. A semiconductor device manufacturing method according to claim 1, wherein said circuit board is a semiconductor substrate, and the step of forming a lower-layer interconnection on said circuit board includes the step of forming an insulating film on the surface of said semiconductor substrate before the formation of the lower-layer interconnection.

4. A semiconductor device manufacturing method according to claim 3, wherein a specified area of said insulating film is used as a dielectric for a capacitor.

5. A semiconductor device manufacturing method according to claim 1, wherein the step of forming the lower-layer interconnection, said metal pillar, and said upper-layer interconnection on said circuit board includes effecting screen printing of a metal paste for the formation of each of these elements.

6. A semiconductor device manufacturing method according to claim 1, wherein the step of forming a lower-layer interconnection on said circuit board includes a step of forming the interconnection by depositing a barrier metal, and the step of forming said metal pillar and said lower-layer interconnection includes a step of forming these elements by effecting screen printing of a metal paste.

7. A semiconductor device manufacturing method according to claim 1, wherein the step of forming said lower-layer interconnection and said metal pillar includes a step of forming each of these elements by effecting screen printing of a metal paste, and the step of forming said upper-layer interconnection includes a step of forming the interconnection by depositing a barrier metal.

*8. A semiconductor device manufactured according to a method comprising the steps of claim 1.*

*9. A multilayer interconnection substrate comprising:*

*a circuit board including a first interconnection layer;*

*a conductive pillar having a rounded apex on the first interconnection layer;*

*an insulating film on the circuit board; and*

*a second interconnection layer on the insulating film, wherein the conductive pillar extends upward through the insulating film to the second interconnection layer, thereby forming an electrical connection with the second interconnection layer.*

*10. The multilayer interconnection substrate as claimed in claim 9, wherein the conductive pillar has a decreasing cross-sectional area along its length relative to the circuit board.*

*11. The multilayer interconnection substrate as claimed in claim 9, wherein the conductive pillar has a resistance of approximately 1.4 m*$\Omega$.

*12. The multilayer interconnection substrate as claimed in claim 10, wherein the conductive pillar comprises gold.*

*13. The multilayer interconnection substrate as claimed in claim 10, wherein the conductive pillar has a resistance of approximately 1.4 m*$\Omega$.

*14. A multilayer interconnection substrate comprising:*

*a circuit board including a first interconnection layer;*

*a conductive pillar, having a rounded apex, formed on the first interconnection layer, the conductive pillar being manufactured by a method comprising the steps of screen printing a metal paste using a screen plate with openings corresponding to desired positions on the first interconnection layer and drying and calcining the printed metal paste;*

*an insulating film on the circuit board; and*

*a second interconnection layer on the insulating film, wherein the conductive pillar extends upward through the insulating film to the second interconnection layer, thereby forming an electrical connection with the second interconnection layer.*

*15. The multilayer interconnection substrate as claimed in claim 14, wherein the conductive pillar comprises gold.*

*16. The multilayer interconnection substrate as claimed in claim 14, wherein the conductive pillar has a resistance of approximately 1.4 mΩ.*

*17. The multilayer interconnecting substrate as claimed in claim 8, wherein the insulating film is made of an organic material.*

*18. The multilayer interconnecting substrate as claimed in claim 17, wherein the organic material is polyimide.*

*19. The multilayer interconnecting substrate as claimed in claim 14, wherein the insulating film is made of an organic material.*

*20. The multilayer interconnecting substrate according to claim 19, wherein the organic material is polyimide.*

*21. An interconnection substrate comprising:*

*a lower wiring layer;*

*an interlayer insulating film having an upper surface and a lower surface, the lower surface contacting the lower wiring layer; and*

*a conductive pillar having a bottom face and a top portion, the bottom face contacting the lower wiring layer, and wherein the conductive pillar penetrates the upper surface of the interlayer insulating film such that only the top portion, formed as having a rounded apex, projects through the upper surface.*

*22. The interconnection substrate as claimed in claim 21, wherein the bottom face of the conductive pillar has a greater cross-sectional area than that of the top portion of the conductive pillar.*

*23. The interconnection substrate as claimed in claim 21, further comprising:*

*an upper wiring layer having a lower surface, and contacting the upper surface of the interlayer insulating film;*

*wherein the top portion of the conductive pillar contacts at least the lower surface of the upper wiring layer, and wherein the upper wiring layer is substantially flat.*

*24. The multilayer interconnection substrate as claimed in claim 21, wherein the insulating film is made of an organic material.*

*25. The multilayer interconnection substrate as claimed in claim 24, wherein the organic material is polyimide.*

*26. A method for forming an interconnection substrate comprising the steps of:*

*forming a lower wiring layer;*

*forming a conductive pillar on the lower wiring layer by screen printing using metal paste, the conductive pillar having a top portion formed as having a rounded apex;*

*forming an interlayer insulating film having a lower surface and an upper surface, wherein the lower surface of the interlayer insulating film contacts the lower wiring layer; and*

*forming an upper wiring layer which contacts both the top portion of the conductive pillar and the upper surface of the interlayer insulating film, and wherein the upper wiring layer is substantially flat.*

*27. The method as claimed in claim 26, wherein the insulating film is made of an organic material.*

*28. The method as claimed in claim 27, wherein the organic material is polyimide.*

*29. A semiconductor device manufacturing method comprising the steps of:*

*forming a lower-layer interconnection on a circuit board on which a plurality of semiconductor chips are mounted;*

*forming a metal pillar on said circuit board, by screen printing using metal paste, said metal pillar having a rounded apex so that the pillar may contact with at least said lower-layer interconnection;*

*forming an insulating film covering said lower-layer interconnection and said metal pillar so that the rounded apex of said metal pillar may be exposed; and*

*forming an upper-layer interconnection on said insulating film so that this layer may contact with the exposed rounded apex of said metal pillar.*

*30. A semiconductor device manufacturing method according to claim 29, wherein said circuit board is a semiconductor substrate, and the step of forming a lower-layer interconnection on said circuit board includes the step of forming an insulating film on the surface of said semiconductor substrate before the formation of the lower-layer interconnection.*

*31. A semiconductor device manufacturing method according to claim 30, wherein a specific area of said insulating film is used as a dielectric for a capacitor.*

*32. A semiconductor device manufacturing method, comprising the steps of:*

*forming a lower-layer interconnection on a circuit board formed of one of a semiconductor substrate and an insulating substrate, a plurality of semiconductor chips being mounted on said semiconductor substrate or said insulating substrate;*

*forming a metal pillar on a predetermined area on said circuit board including said lower-layer interconnection, the metal pillar forming step including the step of effecting screen printing of a metal paste using a screen plate with openings corresponding to desired positions on the lower-layer interconnection and the step of drying and calcining said printed metal paste by heat treatment to form the metal pillar;*

*forming an insulating film covering said lower-layer interconnection and said metal pillar so that the tip of said metal pillar is exposed; and*

*forming an upper-layer interconnection on said insulating film so that the upper-layer interconnection is in contact with the exposed tip of said metal pillar,*

*wherein said screen plate is supported by a fixed frame and a movable frame which is pivoted on the fixed frame so that one end of said movable frame on the side of a free end of said screen plate is lifted upward as the movement of a squeegee used for transferring said metal paste onto lower-layer interconnection, and so that an angle between the printing surface of the circuit board and the movable frame is increased gradually, thereby bringing a gap between said printing surface of the circuit board and the screen plate to zero at the printing.*

*33. A semiconductor device manufacturing method according to claim 1, wherein the metal pillar is formed by said metal pillar forming step so that the metal pillar has a top portion formed as having the rounded apex and a bottom face having a greater cross-sectional area than that of the top portion.*

* * * * *